(12) United States Patent
Yamamura et al.

(10) Patent No.: US 7,485,547 B2
(45) Date of Patent: Feb. 3, 2009

(54) METHOD OF FABRICATING SEMICONDUCTOR DEVICE

(75) Inventors: Megumi Yamamura, Hyogo-ken (JP); Toshihide Shimmei, Hyogo-ken (JP); Tetsuya Kaji, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 11/041,697

(22) Filed: Jan. 25, 2005

(65) Prior Publication Data

US 2005/0250296 A1 Nov. 10, 2005

(30) Foreign Application Priority Data

May 7, 2004 (JP) .............................. 2004-138689

(51) Int. Cl.
*H01L 21/78* (2006.01)
*H01L 21/46* (2006.01)
*H01L 21/301* (2006.01)

(52) U.S. Cl. ........................ 438/460; 438/458; 438/459; 438/464

(58) Field of Classification Search ................. None
See application file for complete search history.

(56) References Cited

U.S. PATENT DOCUMENTS 6,713,366 B2 * 3/2004 Mong et al. ................. 438/459
6,730,579 B1 * 5/2004 Sasaka ....................... 438/464
6,759,745 B2 * 7/2004 Masumoto et al. .......... 257/730
6,849,524 B2 * 2/2005 Shelton et al. .............. 438/465
6,933,489 B2 * 8/2005 Fujii et al. ................. 250/214.1
7,129,114 B2 * 10/2006 Akram ....................... 438/110

FOREIGN PATENT DOCUMENTS

| JP | 6-268060 | 9/1994 |
|----|----------|--------|
| JP | 10-92778 | 4/1998 |
| JP | 10-284449 | 10/1998 |
| JP | 2002-43251 | 2/2002 |
| JP | 2003-257897 | 9/2003 |
| JP | 2004-186522 | 7/2004 |

\* cited by examiner

*Primary Examiner*—Zhandra Smith
*Assistant Examiner*—Khanh B Duong
(74) *Attorney, Agent, or Firm*—Oblon, Spivak, McClelland, Maier & Neustadt, P.C.

(57) ABSTRACT

A method of fabricating semiconductor device is described. There is provided a method of fabricating a semiconductor device including, sticking a first protective tape on a first surface of a semiconductor substrate, polishing a second surface of the semiconductor substrate faced to the first surface, sticking a second protective tape on the second surface of the semiconductor substrate, removing the first protective tape, dicing the semiconductor substrate from the first surface side to separate the semiconductor substrate to a plurality of semiconductor chips, sticking a third protective tape on the first surface of a plurality of the semiconductor chips, removing the second protective tape, and etching a cutting surface of the semiconductor chip and the second surface of the semiconductor chip by dry etching.

16 Claims, 10 Drawing Sheets ated. Japanese Patent Publication No. PH10-82778 discloses an approach for preventing the crack and the lack generation in the semiconductor substrate. Furthermore, processing and carrying on a thinned semiconductor substrate between processing steps of evaporating a metal electrode film and processing steps of dicing the thinned semiconductor substrate are performed under a condition of sticking a protective tape on the surface of the thinned semiconductor substrate. Accordingly, the crack and the lack generation in the thinned semiconductor substrate can be suppressed.

Furthermore, mounting a thinned semiconductor device on a thin package, such as IC CARD and IC TAG, or a multi chip package (MCP) for layered semiconductor chips have been required in recent years. Therefore, a thinning technique obtaining a thickness of below approximately 90 μm on the semiconductor substrate having a diameter of over 200 mm is desired after fabricating semiconductor elements.

However, in the previous Japanese Patent Publication No. PH10-82778, processing and carrying the semiconductor substrate between processing steps of thinning the semiconductor substrate and processing steps of forming an electrode on the back surface of the semiconductor substrate are performed under a condition without sticking the protective tape on the surface of the semiconductor substrate. Accordingly, the crack and the lack by local stress in the semiconductor substrate are easily generated in the large diameter semiconductor substrate having a thickness of below approximately 90 μm between thinning the semiconductor substrate and forming the electrode.

Moreover, when separating thinned semiconductor substrate with a metal electrode film on the back surface to semiconductor chips by such as blade-dicing, a tipping and a lack on the cutting surface and the back surface near the dicing line of the semiconductor chip and a burr of the metal electrode film are easily generated, as hardness of the semiconductor substrate has a difference from that of the metal electrode.

SUMMARY OF INVENTION

According to an aspect of the present invention, there is provided, a method of fabricating a semiconductor device, including, sticking a first protective tape on a first surface of a semiconductor substrate, polishing a second surface of the semiconductor substrate faced to the first surface, sticking a second protective tape on the second surface of the semiconductor substrate, removing the first protective tape, dicing the semiconductor substrate from the first surface side to separate the semiconductor substrate to a plurality of semiconductor chips, sticking a third protective tape on the first surface of a plurality of the semiconductor chips, removing the second protective tape, and etching a cutting surface of the semiconductor chip and the second surface of the semiconductor chip by dry etching.

Further, according to another aspect of the present invention, there is provided a method of fabricating a semiconductor device, comprising sticking a first protective tape on a first surface of a semiconductor substrate, polishing a second surface of the semiconductor substrate faced to the first surface, dicing the semiconductor substrate from the second surface side to separate the semiconductor substrate to a plurality of semiconductor chips, and etching a cutting surface of the semiconductor chip and the second surface of the semiconductor chip by dry etching.

DETAILED DESCRIPTION OF THE INVENTION

Embodiments of the present invention will be described hereinafter in detail with reference to the drawings mentioned above.

Figure 1:
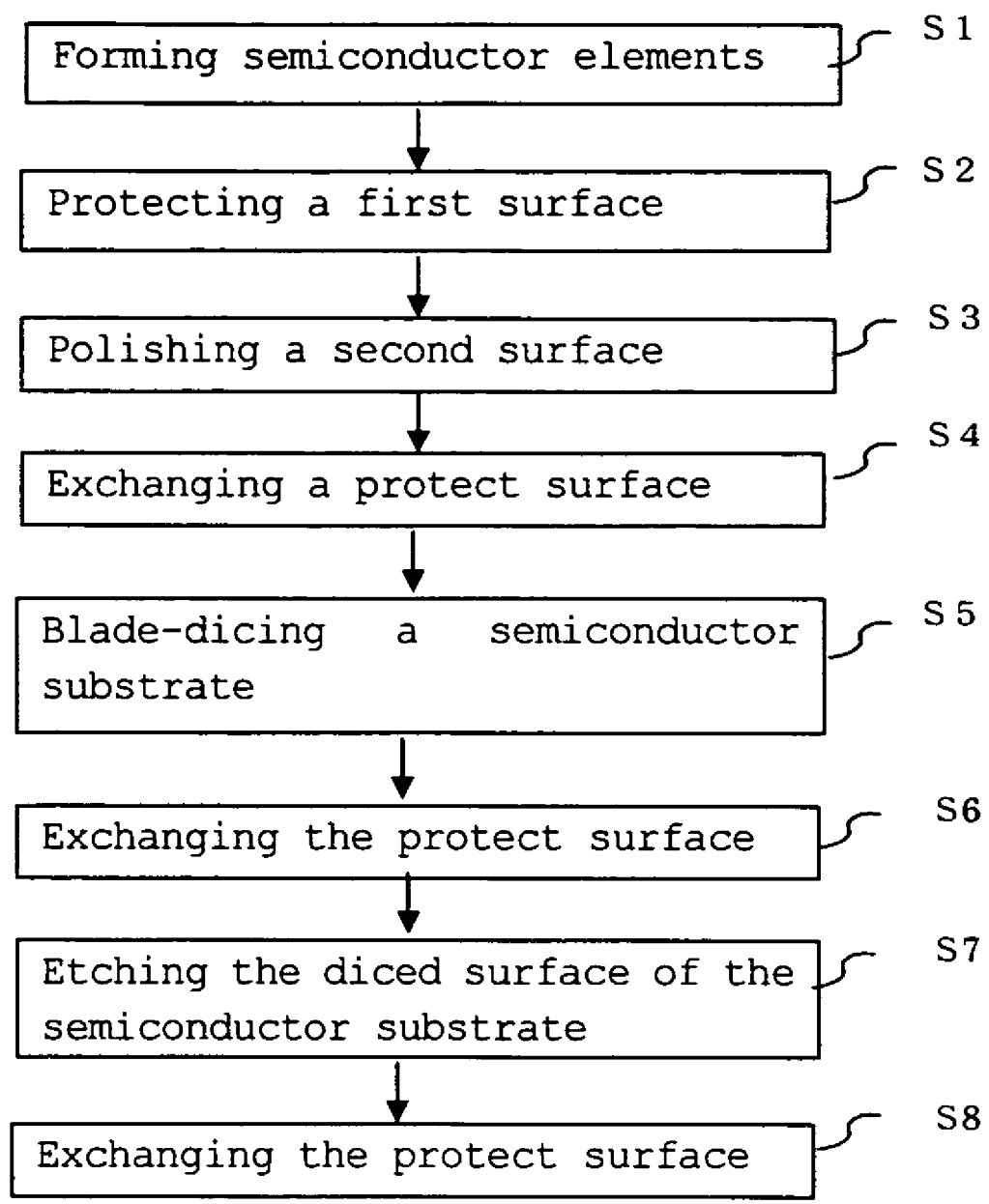
FIG. 1 is a flow chart showing processing steps of a semiconductor device according to a first embodiment of the present invention.

Processing steps of a semiconductor device according to a first embodiment of the present invention is explained hereinafter in detail with reference to FIG. 1 and FIG. 2. FIG. 1 is a flow chart showing processing steps of the semiconductor device. FIG. 2A-2F are cross-sectional views showing a fabrication method of the semiconductor device.

Figure 2A:
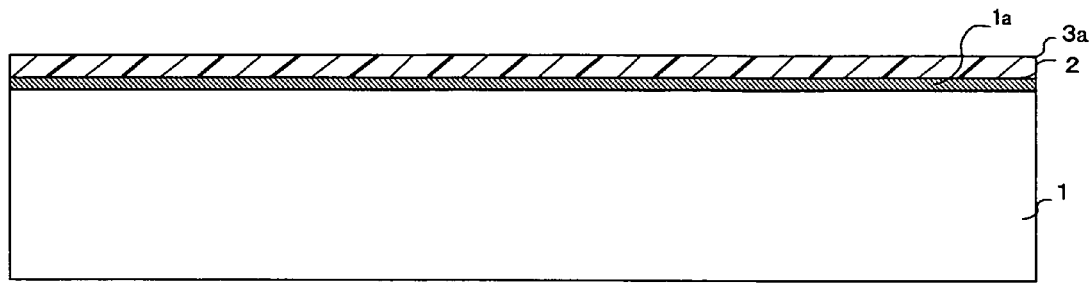
FIGS. 2A-2F are cross-sectional views showing a fabrication method of the semiconductor device according to the first embodiment of the present invention.

As shown in FIG. 2A, semiconductor elements 1a are formed on a silicon substrate 1 by using conventional processing steps of a semiconductor device (step S1). For example, the silicon substrate 1 has a diameter of 8 inches (200 mm). A first protective tape 3a is sticking on a top surface 2 (first surface) of the silicon substrate 1 (step S2). The first protective tape 3a prevent the semiconductor elements 1a from breaking under processing steps of polishing a back surface 4 (second surface) of the silicon substrate 1. The first protective tape 3a is a conventional protective tape for polishing a semiconductor substrate. For example, the tape is made of a polyester resin film with an acrylic resin adhesive. The film is a thickness of 50-100 μm and the adhesive is a thickness of 10-50 μm.

Figure 2B:
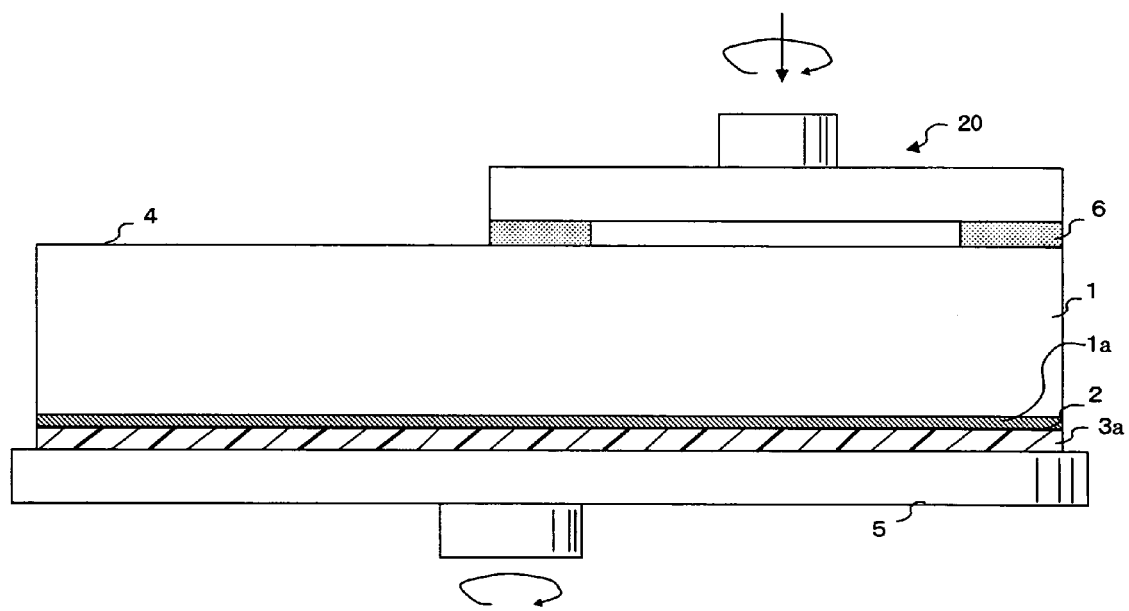

As shown in FIG. 2B, the silicon substrate 1 is installed in a grinding equipment 20 with a vacuum absorption table 5 holding the silicon substrate 1 by vacuum absorption and rotating the silicon substrate 1 and with a grinding whetstone 6 faced to the vacuum absorption table 5. The grinding whetstone 6 is horizontally moved and rotated for grinding the silicon substrate 1. The back surface 4 of the silicon substrate 1 faced to the top surface 2 is polished by using the grinding equipment 20 (step S3).

Figure 2C:
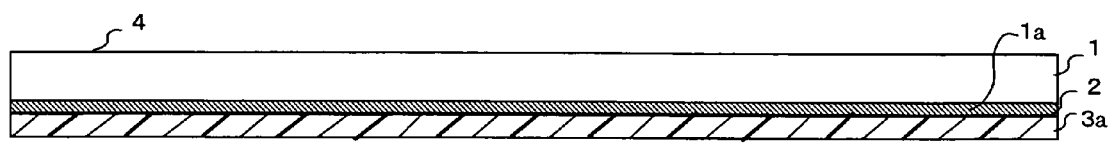

The top surface 2 of the silicon substrate 1 stuck with the first protective tape 3a is equipped on the vacuum absorption table 5 and absorbed by a vacuum system. The back surface 4 is polished by the grinding whetstone 6 with rough meshes. Successively, the back surface 4 is polished by the grinding whetstone 6 with fine meshes, such as the No. 3000 grinding whetstone. A microscopic crushed-layer generated in polishing steps by the grinding whetstone 6 with the rough meshes is removed so as to obtain the back surface 4 mirror-polished as shown in FIG. 2C. The silicon substrate 1 is thinned down to a thickness of below 90 μm, for example, approximately 30 μm.

A second protective tape 3b is stuck on the back surface 4 of the silicon substrate 1. The second protective tape 3b is also made of the same as the first protective tape 3a. For example, the tape is made of a polyester resin film with an acrylic resin adhesive. The film is a thickness of 50-100 μm and the adhesive is a thickness of 10-50 μm. The first protective tape 3a on the top surface 2 of the silicon substrate 1 is removed. The protect surface of the silicon substrate 1 is exchanged from the top surface 2 to the back surface 4 by the processing steps mentioned above (step S4).

Figure 2D:
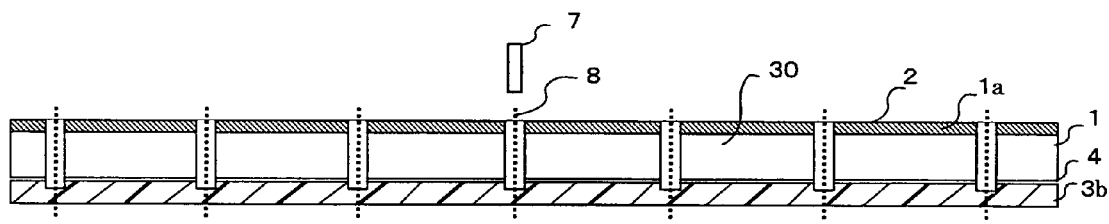

The silicon substrate 1 is separated to silicon chips by full-cut dicing (full-cut blade-dicing). As shown in FIG. 2D, the silicon substrate 1 is cut from the back surface side to the top surface side by using a dicing equipment 7 for a cutting line 8 as a center. A blade of dicing equipment 7 reaches into a portion of the second protective tape 3b through the silicon substrate 1. As a result, the silicon substrate 1 is separated to a plurality of silicon chips 30 (step S4). A position of the cutting line 8 in the silicon substrate 1 is determined by detecting a metal interconnection layer formed on the top surface 2 or a dicing line edge formed on the top surface 2. The blade of the dicing equipment 7 may have a grain size with capability of suppressing a tipping generation on the back surface and forming a comparatively narrow calf width (a width of a dicing groove).

Figure 2E:
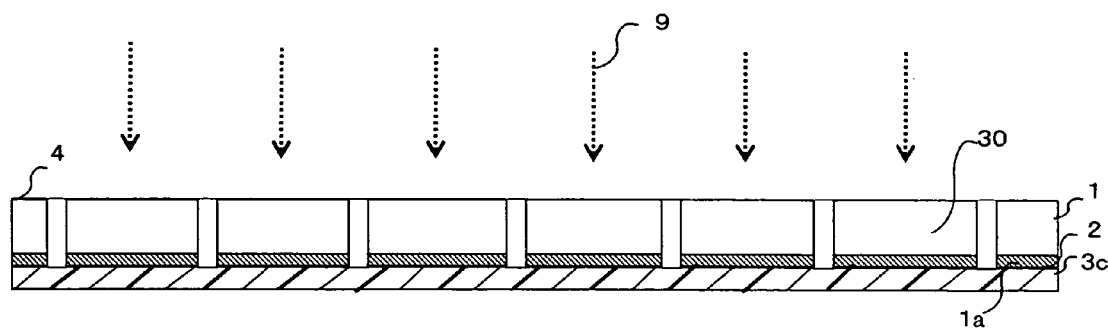

As shown in FIG. 2E, a third protective tape 3c is stuck on the top surface 2 of the silicon chip 30. The third second protective tape 3c is also made of the same as the first protective tape 3a. For example, the tape is made of a polyester resin film with an acrylic resin adhesive. The film is a thickness of 50-100 μm and the adhesive is a thickness of 10-50 μm. The second protective tape 3b on the back surface 4 of the silicon chips 30 is removed (step S6).

As shown in FIG. 2E, an organic layer on the back surface 4 of the silicon chip 30 is removed and a microscopic tipping of a cutting surface, a lack and a crushed layer of the silicon chip 30 is also removed by using chemical dry etching (step S7). The generated plasma in chemical dry etching has a comparatively longer life time and plasma damage to the silicon chip 30 is suppressed comparatively less. Mixed gases of CF4, N2, O2 and C12 are employed in the chemical dry etching process. A surface roughness (Ra) of the back surface 4 may be below 1 μm, for example approximately 0.05 μm for suppressing micro roughness.

Reactive ion etching and another dry etching may be used for dry etching. Furthermore, a surface feature measurement by contact method is used for measuring a surface roughness. A surface roughness measurement by non-contact method with laser irradiation and a surface feature measurement by non-contact method may also be used for the surface roughness.

Figure 2F:
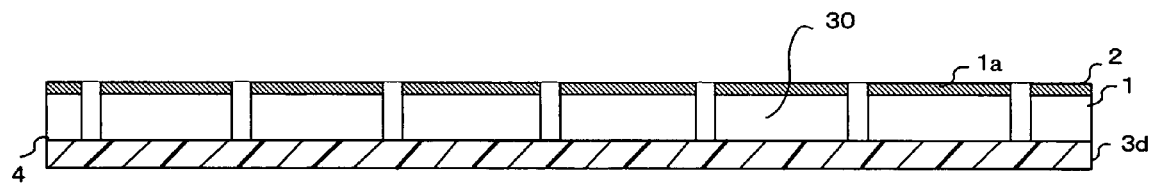

As shown in FIG. 2F, a fourth protective tape 3d is stuck on the back surface 4 of the silicon chip 30. The fourth protective tape 3d is also made of the same as the first protective tape 3a. For example, the tape is made of a polyester resin film with an acrylic resin adhesive. The film is a thickness of 50-100 μm and the adhesive is a thickness of 10-50 μm. The third protective tape 3c on the top surface 2 of the silicon chip 30 is removed (step S8). Next, processing steps move to mounting steps forming a thin package or a multi chip package having layered semiconductor chips to complete a semiconductor device.

As mentioned above, in the method of fabricating semiconductor device of the first embodiment, the protective tapes are ongoingly stuck on the back surface 4 or the top surface 2 of the silicon substrate 1 and the silicon chip 30 during processing and carrying the silicon substrate 1 in steps of thinning back surface 4.

Therefore, the crack and the lack of the silicon substrate 1 or the silicon chip 30 can be greatly decreased by thoroughly protective technique.

Furthermore, as the diced surface of the silicon chip 30 is etched by chemical dry etching, the microscopic tipping and the microscopic crack of the cutting surface of the silicon chip 30 and the crushed layer on the back surface 4 can be also removed.

Figure 3:
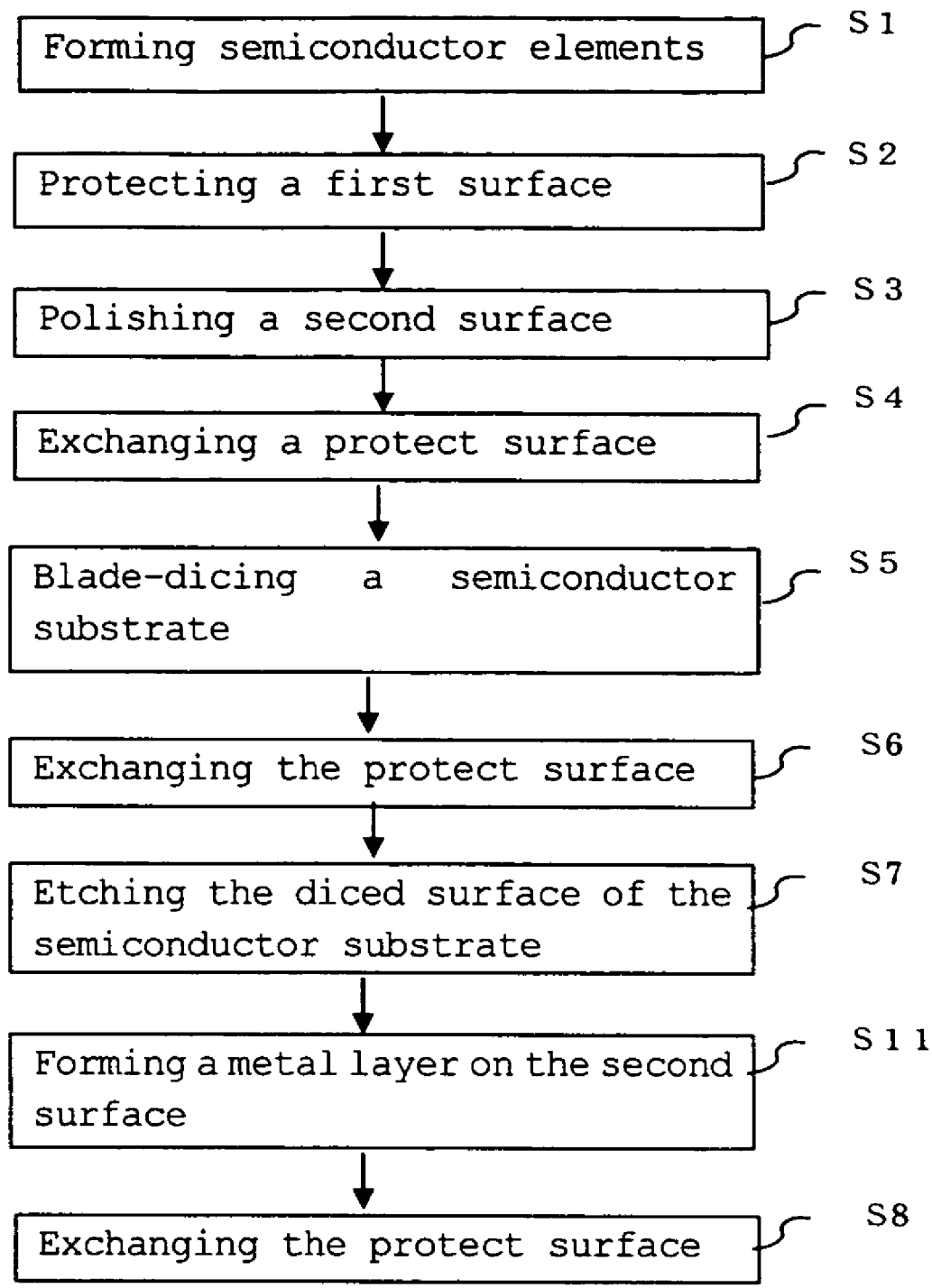
FIG. 3 is a flow chart showing processing steps of a semiconductor device according to a second embodiment of the present invention.

Processing steps of a semiconductor device according to a second embodiment of the present invention is explained hereinafter in detail with reference to FIG. 3 and FIG. 4. FIG. 3 is a flow chart showing the processing steps of the semiconductor device. FIG. 4A-4B are cross-sectional views showing a fabrication method of the semiconductor device. The present embodiment has a feature that a metal film is formed on the back surface of the semiconductor substrate 1 and the semiconductor chip 30.

Figure 4A:
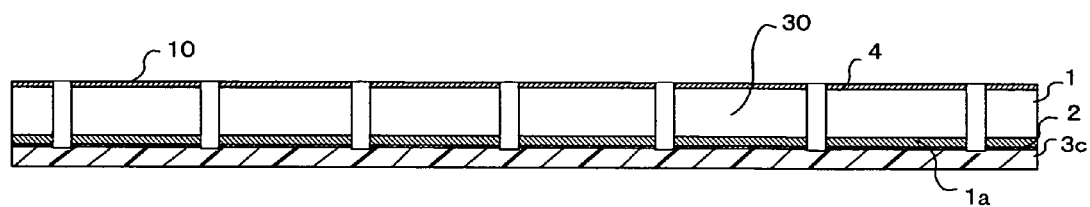
FIGS. 4A-4B are cross-sectional views showing a fabrication method of the semiconductor device according to the second embodiment of the present invention.
Figure 4B:
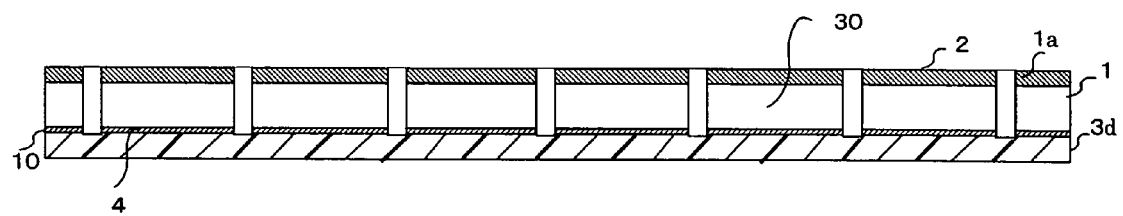

In FIG. 4A-4B, a portion of a same composition as the first embodiment is attached the same number. Therefore, explanation on the same number in FIG. 4A-4B is omitted.

FIG. 4A shows a cross-sectional view of the semiconductor device processed by chemical dry etching through the same processing steps as the first embodiment (step S7). A metal film 10 is formed on the back surface 4 of the silicon chip 30 (step S11). The metal film 10 is a stacked layer having vanadium/nickel/gold formed by evaporation. The vanadium/nickel film is formed to improve adhesion between the silicon chip 30 and the gold film. A thickness of the gold film is above approximately a few μm. On the other hand, a thickness of the vanadium/nickel film is comparatively thinner, for example, approximately 100 nm. A titanium film, a titanium nitride film, a tungsten nitride film or a tungsten-silicon compound film may be used for a metal film instead of the vanadium/nickel film. Further, a copper film or a tungsten film may be also used for a metal film instead of the gold film. A mono-gold film may be also used for the metal film 10 instead of the vanadium/nickel/gold film. Moreover, sputtering may be employed instead of evaporation for forming the metal film 10.

An organic layer on the back surface 4 of the silicon chip 30 is removed, further, the microscopic tipping and the lack of a cutting surface of the silicon chip 30 and the crushed layer of the silicon chip 30 is also removed by using chemical dry etching. Moreover, adhesion between the metal film 10 and the back surface 4 of the silicon chip 30 is also improved by using chemical dry etching. The surface roughness (Ra) of the back surface 4 is controlled below 0.4 μm or less and above 0.05 μm or more, because adhesion between the metal film 10 and the back surface 4 of the silicon chip 30 deteriorates when the surface roughness (Ra) is above 0.4 μm.

As shown in FIG. 4B, a fourth protective tape 3d is stuck on the metal film 10 formed on the silicon chip 30. The third protective tape 3c on the top surface 2 of the silicon chip 30 is removed (step S8).

As mentioned above, in the method of fabricating semiconductor device of the second embodiment, the protective tapes are ongoingly stuck on the back surface 4 or the top surface 2 of the silicon substrate 1 and the silicon chip 30 during processing and carrying the silicon substrate 1 in steps of thinning back surface 4. The diced silicon chip 30 is etched by chemical dry etching. Therefore, the present embodiment has same effects as the first embodiment.

As the back surface 4 and the cutting surface of the silicon chip 30 is etched by chemical dry etching prior forming the metal film 10, generation of a burr in the metal film 10 formed on the back surface 4 of the silicon chip 30 is greatly decreased. As surface roughness (Ra) of the back surface 4 of the silicon chip 30 is 0.05-0.4 μm, the adhesion between the metal film 10 and the back surface 4 of the silicon chip 30 is strengthened.

Figure 5:
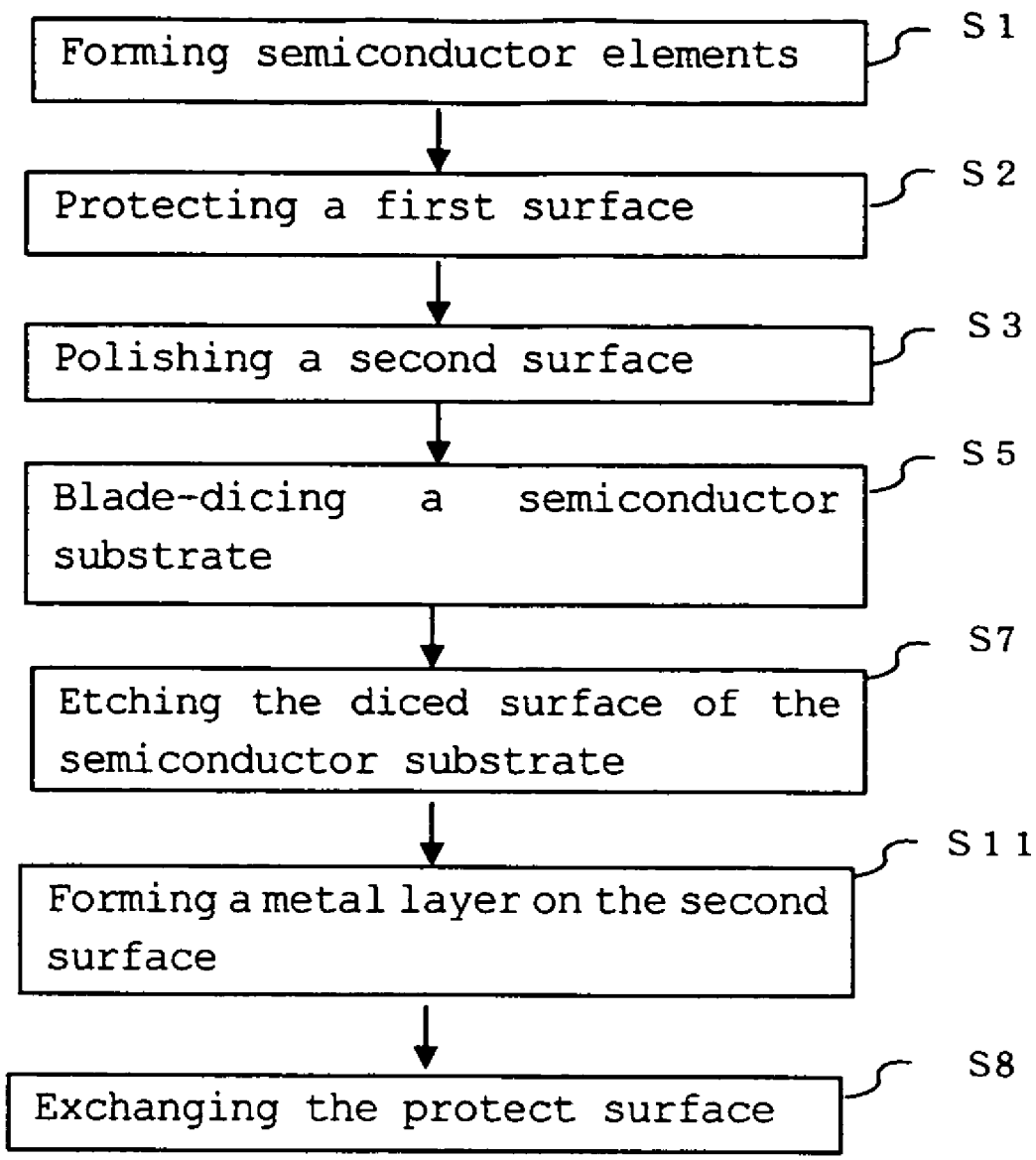
FIG. 5 is a flow chart showing processing steps of a semiconductor device according to a third embodiment of the present invention.

Processing steps of a semiconductor device according to a third embodiment of the present invention is explained hereinafter in detail with reference to FIG. 5 and FIG. 6. FIG. 5 is a flow chart showing the processing steps of the semiconductor device. FIG. 6A-6B are cross-sectional views showing a fabrication method of the semiconductor device. The present embodiment has a feature that processing steps of the back surface of the silicon substrate is shortened.

Figure 6A:
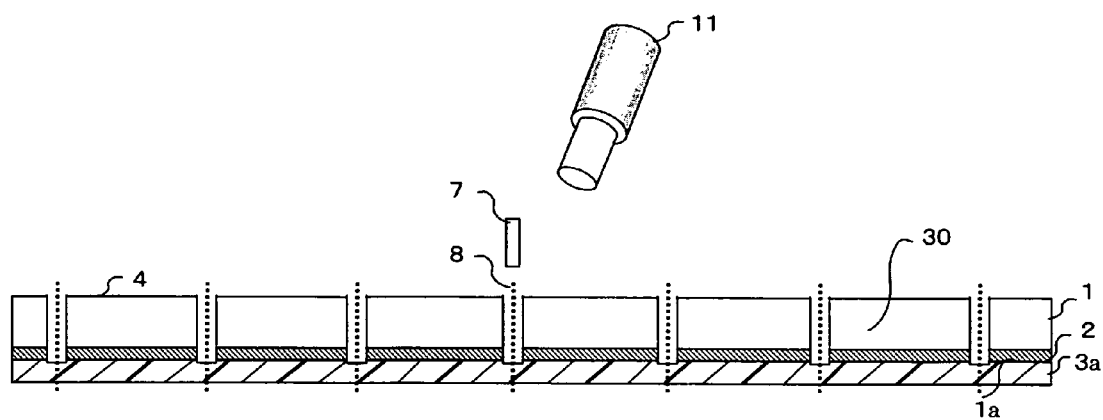
FIGS. 6A-6B are cross-sectional views showing a fabrication method of the semiconductor device according to the third embodiment of the present invention.
Figure 6B:
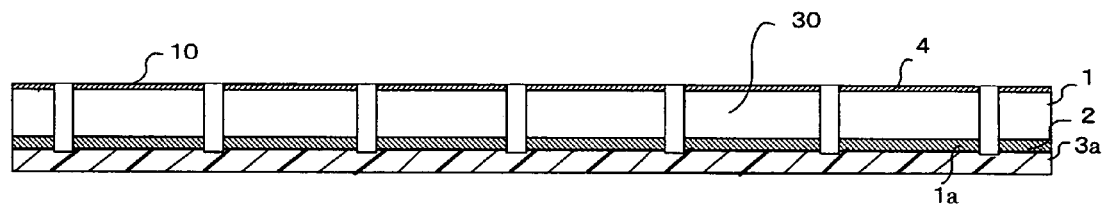

In FIG. 6A-6B, a portion of a same composition as the first embodiment is attached the same number. Therefore, explanation on the same number in FIG. 6A-6B is omitted.

FIG. 6A shows a cross-sectional view of the semiconductor device processed by back surface polishing through the same processing steps as the first embodiment (step S3). The silicon substrate 1 is separated to silicon chips by full-cut dicing (full-cut blade-dicing). The silicon substrate 1 is cut from the back surface side to the top surface side by using the dicing equipment 7 for the cutting line 8 as a center (step S5). The blade of the dicing equipment 7 reaches into a portion of the second protective tape 3b through the silicon substrate 1. As a result, the silicon substrate 1 is separated to the plurality of silicon chips 30.

A position of the cutting line 8 in the silicon substrate 1 is determined by detecting metal interconnection layer formed on the top surface 2 or a dicing line edge formed on the top surface 2 using an infra-red microscope 11. Infra-red wave length (λ) used for infra-red microscopy is 1,300-1,600 nm, for example 1,360 nm for a silicon device and 1,300-1,500 nm for a GaAs device. The blade of the dicing equipment 7 may have a grain size with capability of suppressing a tipping of the back surface and forming a comparatively narrow calf width.

In the present embodiment, exchanging the protect surface on the silicon chip 30 and processing a prior treatment such as cleaning the surfaces are skipped. The back surface 4 of the silicon chip 30 is etched by reactive ion etching with the first protective tape 3a on the top surface 2 (step S7). The metal film 10 is formed on the back surface 4 of the silicon chip 30 (step S11). Accordingly, a clean surface without organic contamination on the silicon chip 30 is retained while surface roughness (Ra) of the back surface 4 is maintained as 0.05-0.4 μm. Mixed gases of SF6 and He are employed in reactive ion etching. Adhesion between the back surface 4 of the silicon chip 30 and the metal film 10 is strengthened by reactive ion etching.

As mentioned above, in the method of fabricating semiconductor device of the third embodiment, the first protective tape 3a is ongoingly stuck on the top surface 2 of the silicon substrate 1 and the silicon chip 30 during processing and carrying the silicon substrate 1 in steps of thinning back surface 4. Therefore, the present embodiment has same effects as the first embodiment.

Dicing the silicon substrate 1, reactive ion etching and forming the metal film 10 are successively performed in a condition of the first protective tape 3a on the top surface 2. Therefore, the cutting surface of the silicon chip 30 is etched by reactive ion etching. As a result, the microscopic tipping, the microscopic lack, and the crushed layer are removed and the burr generation is greatly decreased. Furthermore, processing steps are also decreased as comparing to that of the second embodiment.

The surface roughness (Ra) of the back surface 4 of the silicon chip 30 is controlled to 0.05-0.4 μm, for example. Moreover, exchanging the protect surface of the silicon chip 30 and processing a prior treatment, such as cleaning the surfaces of the silicon chip 30, are skipped. As a result, adhesion between the metal film 10 and the back surface 4 of the silicon chip 30 is strengthened as comparing to that of the second embodiment.

Figure 7:
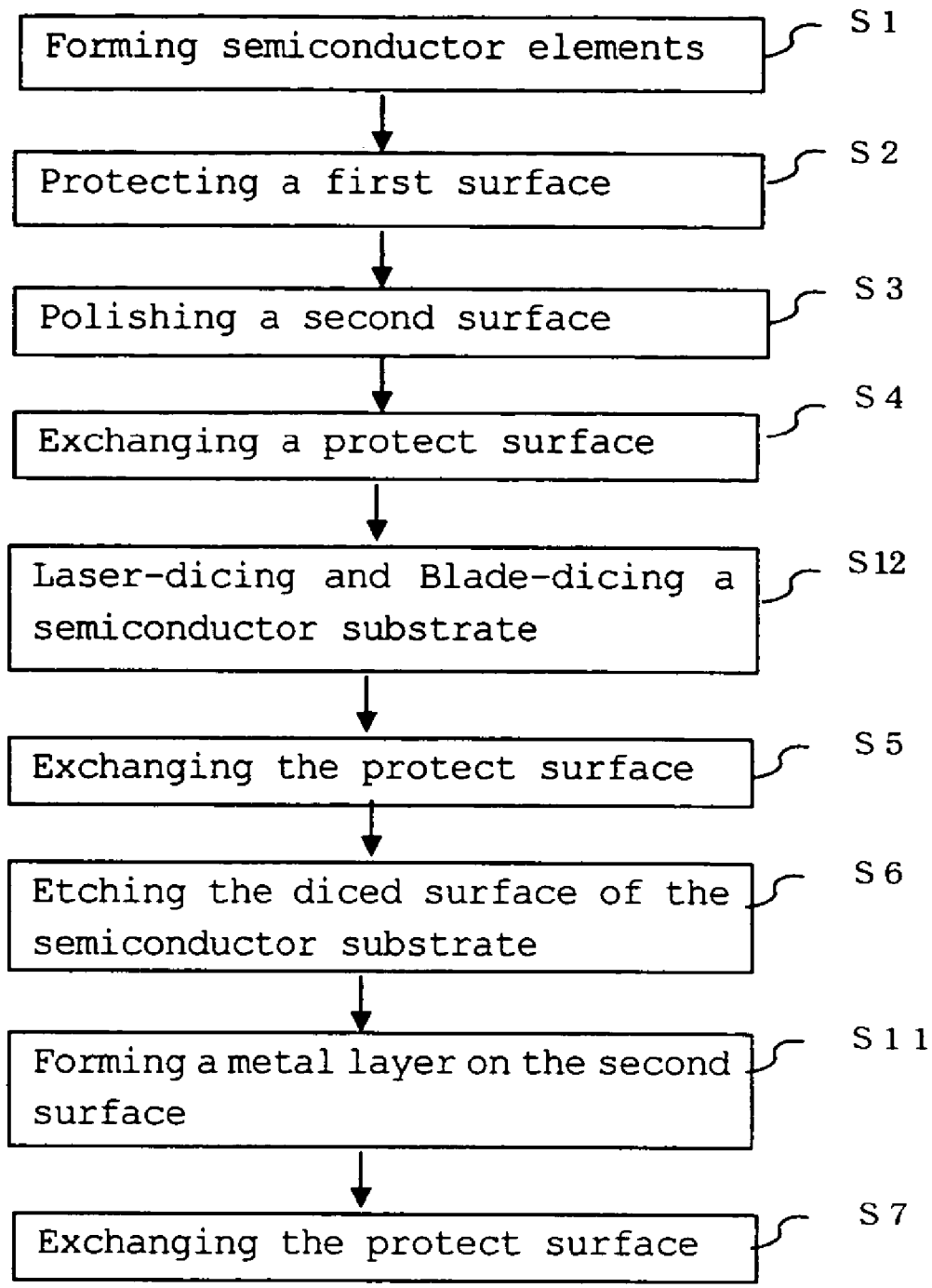
FIG. 7 is a flow chart showing processing steps of a semiconductor device according to a fourth embodiment of the present invention.

Processing steps of a semiconductor device according to a fourth embodiment of the present invention is explained hereinafter in detail with reference to FIG. 7 and FIG. 8. FIG. 7 is a flow chart showing the processing steps of the semiconductor device. FIG. 8A-8B are cross-sectional views showing a fabrication method of the semiconductor device.

Figure 8A:
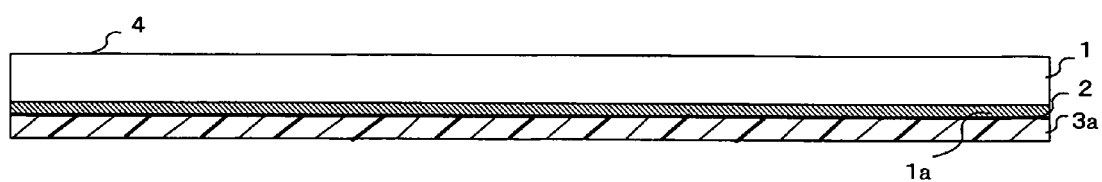
FIGS. 8A-8B are cross-sectional views showing a fabrication method of the semiconductor device according to the fourth embodiment of the present invention.
Figure 8B:
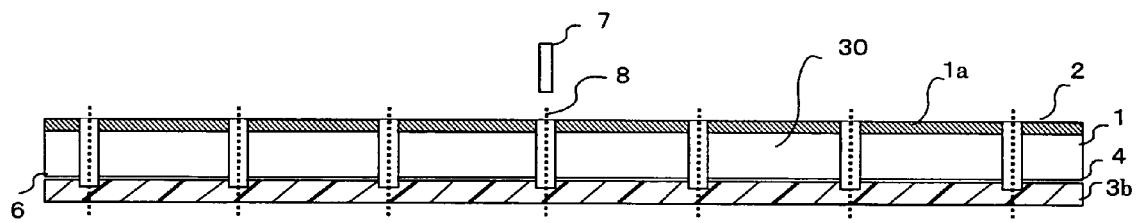

In FIG. 8A-8B, a portion of a same composition as the first embodiment is attached the same number. Therefore, explanation on the same number in FIG. 8A-8B is omitted.

FIG. 8A shows a cross-sectional view of the semiconductor device processed by back surface polishing through the same processing steps as the first embodiment (step S3). Following exchanging the protect surface (step S4), a shallow groove is formed on the top surface 2 the silicon substrate 1 for the cutting line 8 as center by using a semiconductor laser. The shallow groove may be formed by dicing equipment 7 with a comparatively wider calf width instead of the laser grooving (step S12).

The silicon substrate 1 is separated to silicon chips by full-cut dicing (full-cut blade-dicing). As shown in FIG. 8B, the silicon substrate 1 is cut from the back surface side to the top surface side by using the dicing equipment 7 (not illustrated) for the cutting line as a center. The blade of the dicing equipment 7 reaches into a portion of the third protective tape 3c through the silicon substrate 1. As a result, the silicon substrate 1 is separated to the plurality of the silicon chips 30. In this case, the calf width is formed narrower than the shallow groove.

The diced surface is etched by chemical dry etching following exchanging a protective surface (step S5-6). The metal film 10 is formed on the back surface 4 of the silicon chip 30 (step S11). As the top surface 2, i.e. the first surface of the silicon chip 30 is retreated from the back surface 4, i.e. the second surface, the metal atoms are not scattered in the evaporation step.

As mentioned above, in the method of fabricating semiconductor device of the fourth embodiment, the protective tapes are ongoingly stuck on the top surface 2 or the back surface 4 of the silicon substrate 1 and the silicon chip 30 during processing and carrying the silicon substrate 1 in steps of thinning back surface 4. Therefore, the present embodiment has same effects as the first embodiment.

Furthermore, the silicon substrate 1 is dicing and etching where the top surface 2 of the silicon substrate 1 is retreated from the back surface 4. The metal film 10 is subsequently formed on the back surface 4 of the silicon chip 30. Accordingly, the microscopic tipping and the microscopic lack in the cutting surface, and crushed layer on the back surface 4 of the silicon chip 30 are removed by chemical dry etching. This leads to greatly suppressing the burr generation of the metal film 10 in the present embodiment than that in the second embodiment.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the method in the embodiments is applied to processing steps of fabricating a silicon device, however, the method can be also applied to processing steps of fabricating compound devices, such as a GaAs device. Further, full-cut dicing may be performed by a laser-cutting instead of the dicing equipment.

What is claimed is:

1. A method of fabricating a semiconductor device, comprising:
    sticking a first protective tape on a first surface of a semiconductor substrate;
    polishing a second surface of the semiconductor substrate faced to the first surface;
    sticking a second protective tape on the second surface of the semiconductor substrate;
    removing the first protective tape;
    dicing the semiconductor substrate from the first surface side to separate the semiconductor substrate to a plurality of semiconductor chips;
    sticking a third protective tape on first surfaces of a plurality of the semiconductor chips;
    removing the second protective tape; and
    etching cutting surfaces of the semiconductor chips and second surfaces of the semiconductor chips by dry etching,
    wherein a surface roughness Rs of the second surface of the semiconductor chips formed by dry etching is 0.05 μm or more and 0.4 μm or less.

2. A method of fabricating a semiconductor device according to claim 1, wherein dicing the semiconductor substrate includes forming a shallow groove in the first surface of the semiconductor substrate and dicing a center portion of a bottom surface in the shallow groove within a narrower width than the shallow groove.

3. A method of fabricating a semiconductor device according to claim 2, wherein the shallow groove is formed by laser irradiation.

4. A method of fabricating a semiconductor device according to claim 2, wherein the shallow groove is formed by dicing.

5. A method of fabricating a semiconductor device according to claim 1, further including positioning a dicing line inside the semiconductor substrate by infra-red microscopy between removing the first protective tape and dicing the semiconductor substrate.

6. A method of fabricating a semiconductor device according to claim 1, wherein etching the cutting surfaces is performed by reactive ion etching.

7. A method of fabricating a semiconductor device according to claim 1, wherein etching the cutting surfaces is performed by chemical dry etching.

8. A method of fabricating a semiconductor device according to claim 1, further including forming a metal film on the second surface of the semiconductor substrate following etching the cutting surface.

9. A method of fabricating a semiconductor device, comprising:
    sticking a first protective tape on a first surface of a semiconductor substrate;
    polishing a second surface of the semiconductor substrate faced to the first surface;
    dicing the semiconductor substrate from the second surface side to separate the semiconductor substrate to a plurality of semiconductor chips;
    etching cutting surfaces of the semiconductor chips and second surfaces of the semiconductor chips by dry etching; and
    forming a metal film on the second surface of the semiconductor substrate.

10. A method of fabricating a semiconductor device according to claim 9, wherein dicing the semiconductor substrate includes forming a shallow groove in the second surface of the semiconductor substrate and dicing a center portion of a bottom surface in the shallow groove within a narrower width than the shallow groove.

11. A method of fabricating a semiconductor device according to claim 10, wherein the shallow groove is formed by laser irradiation.

12. A method of fabricating a semiconductor device according to claim 10, wherein the shallow groove is formed by dicing.

13. The method of fabricating a semiconductor device according to claim 10, further comprising;
    removing the first protective tape from the first surface;
    positioning a dicing line inside the semiconductor substrate by infra-red microscopy between removing the first protective tape and dicing the semiconductor substrate.

14. A method of fabricating a semiconductor device according to claim 9, wherein etching the cutting surfaces is performed by reactive ion etching.

15. A method of fabricating a semiconductor device according to claim 9, wherein etching the cutting surfaces is performed by chemical dry etching.

16. A method of fabricating a semiconductor device, comprising:
- sticking a first protective tape on a first surface of a semiconductor substrate;
- polishing a second surface of the semiconductor substrate faced to the first surface;
- dicing the semiconductor substrate from the second surface side to separate the semiconductor substrate to a plurality of semiconductor chips; and
- etching cutting surfaces of the semiconductor chips and second surfaces of the semiconductor chips by dry etching;
- wherein a surface roughness Rs of the second surface of the semiconductor chips formed by dry etching is 0.05 μm or more and 0.4 μm or less.

* * * * *